United States Patent
Koch et al.

(10) Patent No.: US 6,192,979 B1
(45) Date of Patent: Feb. 27, 2001

(54) USE OF PLASMA POLYMER LAYER SEQUENCES AS FUNCTIONAL LAYERS IN MATERIAL TRANSPORT OR HEAT EXCHANGER SYSTEMS

(75) Inventors: Gerd Koch, Lünen; Alfred Leipertz, Erlangen; Martin Grischke, Wendeburg, all of (DE)

(73) Assignee: Fraunhofer-Gesellschaft zur Foderung der angewandten Forschung e.V., Munich (DE)

( * ) Notice: Subject to any disclaimer, the term of this patent is extended or adjusted under 35 U.S.C. 154(b) by 0 days.

(21) Appl. No.: 08/973,399

(22) PCT Filed: Jun. 4, 1996

(86) PCT No.: PCT/DE96/01022

§ 371 Date: Dec. 29, 1997

§ 102(e) Date: Dec. 29, 1997

(87) PCT Pub. No.: WO96/41901

PCT Pub. Date: Dec. 27, 1996

(30) Foreign Application Priority Data

Jun. 12, 1995 (DE) .............................. 195 21 344

(51) Int. Cl.[7] .............................. F28F 21/02; C23C 16/26

(52) U.S. Cl. ...................... 165/201; 165/287; 427/248.1; 427/249.7

(58) Field of Search ................................ 427/255.6, 490, 427/491, 248.1, 249, 577; 165/201, 287, 58, 148, 177

(56) References Cited

U.S. PATENT DOCUMENTS

| | | | |
|---|---|---|---|
| 3,971,634 | * | 7/1976 | Ranken et al. .................. 165/105 |
| 4,333,518 | * | 6/1982 | Frost et al. .................. 165/8 |
| 4,343,763 | * | 8/1982 | McGuire .................. 376/314 |
| 4,459,976 | * | 7/1984 | Speros .................. 126/449 |
| 4,512,394 | * | 4/1985 | Kauffman .................. 165/86 |
| 4,594,330 | * | 6/1986 | Suzuki et al. .................. 501/92 |

(List continued on next page.)

FOREIGN PATENT DOCUMENTS

| | | |
|---|---|---|
| 0625588 | 11/1994 | (EP) . |
| 4417235 | 11/1994 | (DE) . |
| 1069535 | 5/1967 | (GB) . |
| 3-44485 | 2/1991 | (JP) . |

OTHER PUBLICATIONS

Patent Abstracts of Japan, vol. 15, No. 181 (C–0830), May 9, 1991.

(List continued on next page.)

*Primary Examiner*—Shrive Beck
*Assistant Examiner*—Bret Chen
(74) *Attorney, Agent, or Firm*—Greenblum & Berstein, P.L.C.

(57) ABSTRACT

A material transport or heat exchanger system. The material transport or heat exchange system includes at least one component including a base material. The at least one component includes a top functional layer capable of adjusting wetting behavior of the base material. The top functional layer includes carbon and hydrogen, and at least one of a non-metallic element and a semi-metallic element selected from the group consisting of 3rd, 4th, 5th, 6th, and 7th main group of the periodic table of elements, and mixtures thereof. A process for treating a surface of at least one component including a base material of a material transport or heat exchanger system. The process includes forming a top functional layer on at least a portion of the at least one component which is capable of adjusting wetting behavior of the base material. The top functional layer includes carbon and hydrogen, and at least one of a non-metallic element and a semi-metallic element selected from the group consisting of 3rd, 4th, 5th, 6th, and 7th main group of the periodic table of elements, and mixtures thereof.

29 Claims, 5 Drawing Sheets

U.S. PATENT DOCUMENTS

| | | | | |
|---|---|---|---|---|
| 4,609,038 | * | 9/1986 | Ishikawa et al. | 165/104.12 |
| 4,824,444 | * | 4/1989 | Nomura | 427/490 X |
| 4,891,292 | * | 1/1990 | Masaki et al. | 430/66 |
| 5,198,263 | * | 3/1993 | Stafford et al. | 427/577 |
| 5,256,509 | * | 10/1993 | Hayashi et al. | 430/66 |
| 5,449,787 | * | 9/1995 | Chetellier et al. | 427/491 X |
| 5,482,602 | * | 1/1996 | Cooper et al. | 427/577 |
| 5,500,095 | * | 3/1996 | Shinagawa et al. | 203/2 |
| 5,585,212 | * | 12/1996 | Ueda | 430/96 X |
| 5,653,106 | * | 8/1997 | Katashiba et al. | 165/104.12 |
| 5,711,814 | * | 1/1998 | Mori | 427/569 |

OTHER PUBLICATIONS

Blackmann et al., "An Investigation of Compounds Promoting the Dropwise Condensation of Steam," J. Appl. Chem., 7, 160–171 (1957).

Watson et al., "The Promotion of Dropwise Condensation by Montan Wax I. Heat Transfer Measurements", J. Appl. Chem., 12, 539–546 (1962).

Tanner et al., "The Promotion of Dropwise Condensation by Montan Wax II. The Composition of Montan Wax and the Mechanism Promotion" J. Appl. Chem., 12, 547–552 (1962).

Finnicum et al., "Dropwise vs. Filmwise Condensation of Steam on Chromium", Int. J. Heat Mass Transfer., vol. 32, No. 8, pp. 1541–1559 (1989).

Mingdao et al., "Heat Transfer by Dropwise Condensation in the Two–Phase Closed Thermosiphons", Proc. Eight Inter. Heat Transfer Conf., vol. 4, pp. 1683–1688 (1986).

Kast, "Theoretische und experimentelle Utersuchung der Warmeubertragung bei Tropfenkondensation {Theoretical and Experimental Testing of Heat Transmission in Dropwise Condensation}", Fortschrittsber, VDI, Series 3, No. 6, Dusseldorf, pp. 1–87 and 3 front pages (1965).

Marto et al., "Evaluation of Organic Coatings for the Promotion of Dropwise Condensation of Steam", Int. J. Heat Mass Transfer., vol. 29, No. 8, pp. 1109–1117 (1986).

Holden et al., "The Use of Organic Coatings To Promote Dropwise Condensation of Steam", ASME J. Heat Transfer., vol. 109, pp. 768–774 (1987).

Mori et al., "Heat Transfer Promotion of an Aluminum–Brass Cooling Tube by Surface Treatment with Triazine Thiols", Langmuir, vol. 7, No. 6, pp. 1161–1166 (1991).

Haraguchi et al., "The Effect of Polyvinylidene Chloride Coating Thickness on Promotion of Dropwise Steam Condensation", Int. J. Heat Mass Transfer., vol. 34, No. 2, pp. 3047–3054 (1991).

Utaka et al., "Study on Dropwise Condensation Curves (Measurement of Propylene Glycol Vapor on PTFE–coated Surface)", Bulletin of JSME, vol. 28, No. 240, pp. 1150–1157 (1987).

Boyes et al., "Wettability of Copper and Polytetrafluoroethylene Surfaces wirh Water–Influence of Environmental Conditions", Chemie–Ing–Techn., 45, 1250–1256 (1973).

Erb, "Promoting Permanent Dropwise Condensation", Industrial and Engineering Chemistry, vol. 57, No. 10, pp. 49–52 (1965).

Cluistra et al., Dropwise Condensation in PTFE–Containg Galvanic Dispersion Layers unpublished in–house report of the AZKO–Engineering Co., Research Laboratories Arnhem, pp. 1–26 (1976).

Zhang et al., "New Surface Materials for Dropwise Condensation", Proc. Eighth International Heat Transfer Conf., vol. 4, pp. 1677–1682 (1986).

Zhao et al., "Surface Materials with Dropwise Condensation Made by Ion Implantation Technology", Int. J. Heat Mass Transfer, vol. 34, No. 11, pp. 2833–2835 (1991).

Zhao et al. "Industrial Application of Dropwise Condensation", Proc. Ninth Inter. Heat Transfer Conf., vol. 4, pp. 391–394(1990).

Bernett et al., "Confirmation of Spontaneous Spreading by Water on Pure Gold", The Journal of Physical Chemistry, vol. 74, No. 11, pp. 2309–2312 (1970).

Smith, "The Hydrophilic Nature of a Clean Gold Surface", Journal of Colloid and Interface Science, vol. 75, No. 1, pp. 51–55 (1980).

Wilkins et al. "Dropwise and Filwise Condensation of Water Vapor on Gold", AlCheE Journal, vol . 19, No. 1, pp. 119–123 (1973).

Tanasawa et al., "What We Don't Know About the Mechanism of Dropwise Condensation", Proc. Fifth Int. Heat Transfer Conf., vol. 7, pp. 186–191 (1974).

Woodruff et al., "Steam Condensation on Various Gold Surfaces", Journal of Heat Transfer, vol. 103, pp. 685–692 (1981).

Barthau et al., "Dropwise Condensatio of Steam—An Experimental Study", Advances in Phase Change Transfer—Proceedings of Inter. Symposium on Phase Change Heat Transfer, May 20–23, 1988, China, pp. 328–333 (1988).

O'Neill et al., "Dropwise Condensation of Steam on Elecroplated Silver Surfaces", Int. J. Heat Mass Transfer, vol. 27, No. 9, pp. 1539–1549 (1984).

Hollinderbaumer et al., "Anbackungen und Albagerungen Feuchter Schuttguter {Cakings and Deposits of Moist Bulk Materials}", Chemie–Ing–Techn., 68, pp. 127–130 (1996).

* cited by examiner

USE OF PLASMA POLYMER LAYER SEQUENCES AS FUNCTIONAL LAYERS IN MATERIAL TRANSPORT OR HEAT EXCHANGER SYSTEMS

BACKGROUND OF THE INVENTION

1. Field of the Invention

The invention relates to the use of plasma polymer layer sequences as functional layers in material transport or heat exchanger systems, by means of which these functional surfaces have definitely adjustable wetting behavior. Their use is advantageous in many fields in which material transport or heat exchange systems are used.

2. Discussion of Background Information

The supply and dissipation of heat or material transport is of central importance for many process technical industrial processes. In the transmission of heat, it is advantageous to use phase transitions (condensation, evaporation) since in this way, very high heat flow densities can be achieved. This will be explained in detail in the procedure of condensation.

In the majority of technical condensers, the fluidization of vapor occurs as film condensation. The heat transfer coefficient can be increased by approximately one order of magnitude if the condensation is carried out as dropwise condensation. In order to achieve this, the surfaces on which the condensation takes place should have a definite wetting behavior which is distinguished by very low surface energies or by an edge angle of >60° relative to water.

It is known that the basic prerequisite for the dropwise condensation is the existence of hydrophobic surfaces (low surface energy) in the condenser. The definite production of condenser surfaces of low surface energy requires the use of specific coatings on the metal parts that are necessary for heat transmission reasons.

It is furthermore known that monomolecular layers based on Langmuir-Blodgett films can have low surface energies. The extremely low thickness of these layers and the low number of possibilities for optimizing their mechanical/corrosive properties make them largely unsuitable for use in technical condensers for longevity reasons.

Other layers are also unsuitable if they cannot withstand the mechanical/corrosive stresses. For the mechanical/corrosive resistance of the layer, if a layer thickness is required that is so great that the thermal resistivity connected with it does not, on the whole, lead to any intensification of the heat transmission capacity (possibly even to a worsening in comparison to the initial system), then this layer is also unsuitable.

Materials that adhere to the metallic base material via physical and/or chemical effects and have been used to achieve incomplete wetting for tests of dropwise condensation include organic compounds with hydrophobic groups, various plastics, inorganic substances, special alloys, and—not without contradictions of different results—precious metals as well. Table 1 represents only a few references for this purpose.

TABLE 1 represents the promoting agent, wherein promoter is understood here to mean all substances effectively used to hydrophobize the base material, to bring about dropwise condensation (the essential tasks, no claim as to completeness). The examples from the literature numbered here are taken from the list in Appendix 1.

| Material/substance | Notes | Reference |
|---|---|---|
| organic compounds | 37 different compounds, 16 of them tested for 500 hours | Blackmann et al. (1) |
| | montan wax | Watson et al. (2) |
| | montan wax | Tanner et al. (3) |
| | oleic acid | Finnicum & Westwater (4) |
| | silicone oil | Mingdao and Jiliang (5) |
| | diff. promoters, overview of different results | Kast (6) |
| polymers | fluoroacrylic, parylene, Emralon 333, | Marto et al. (7) |
| | fluoroepoxy polymerized triazine dithiol | Marto et al. (8) |
| | films on Al/Mg tubes | Mori et al. (9) |
| | PVC layers | |
| | PTFE layer | Haraguchi et al. (10) |
| | PTFE wetting analysis | Utaka et al. (11) |
| | | Boyes & Ponter (12) |
| inorganic compounds | sulfides and Se compounds galvanic | Erb & Thelen (13) |
| | dispersion layer, esp. with PTFE dispersion | Cluistra et al. (14) |
| alloys | surface alloy, CU with Cr, Fe, Al, Bi, Sb, Sn, Se, In | Zhang et al. (15) |
| | Ion implantation N, He, Ar, H | Zhao et al. (16) |
| | Ion implantation Cr, N in Cu | Zhao et al. (17) |
| precious metals | Gold, according to this, pure gold surfaces can be completely wet | Bernett & Zisman (18) and Smith (19) |
| | Gold gilded with paraffin-thio-silane, and mercaptan, vacuum coated gold coatings, partially chemically treated silver, dep. via electroplating | Wilkins et al. (20) |
| | | Tanasawa & Westwater (21) |
| | | Woodruff & Westwater (22) |
| | | Barthau (23) |
| | | O'Neill & Westwater (24) |

In all of the tests of dropwise condensation, in addition to the clarification of purely heat technical questions, the test of conceivable promoters forms the basis of the achievement of dropwise condensation and constitutes the main focus of the research.

Out of all of the research results that indisputably demonstrate possibilities for achieving dropwise condensation, until now, no methodology has come into use in the practical construction of condensers. This is brought about by the still insufficient proofs as to the service life of promoter layers and the resulting lack of certainty of a long term maintenance of dropwise condensation.

It is now the object of the invention to find functional layers that can be deposited by means of conventional coating methods on the functional surfaces of the corresponding apparatuses and devices for these material transport or heat exchanger systems, e.g. condensers, whose use will eliminate the disadvantages of the prior art.

It is consequently the object of the invention to find functional layers of the type mentioned, which can be used in all material transport or heat exchanger systems, e.g. also or even especially in condensers, which in the event that the functional layers are used on condensers, force the dropwise condensation and can advantageously be used in the systems and apparatus construction.

According to the invention, this object is attained through the use of a plasma polymer layer sequence as a functional layer in material transport or heat exchanger systems.

In these material transport or heat exchanger systems with a definitely adjustable wetting behavior, the functional layers that are deposited on the base material of the functional surfaces of apparatuses for heat and material transfer, plasma-modified carbon—hydrogen layers (a-C:H layers or DLC (diamond-like carbon) layers). These plasma-modified carbon—hydrogen layers are comprised of a plasma polymer layer sequence as a hard material layer with a top layer as a functional layer as well as possibly an intermediary layer and a gradient layer, wherein for adjusting a definite wetting behavior, in addition to the base elements of carbon and hydrogen, the top layer contains other non-metallic or metalloid elements of the 1st, 3rd, 4th, 5th, 6th, and/or 7th main group of the periodic table of the elements (preferably 1 at % to 70 at % in relation to the carbon content). These layers can be produced using conventional PVD or CVD processes, e.g. a plasma-enhanced chemical vapor deposition (PECVD) process. These layers are known per se and are described in DE 44 17 235, even with regard to manufacturing possibilities.

It has surprisingly turned out that in particular assembly regions of the top layer, these layers can be used to excellent effect as functional layers in or on plate heat exchangers (composition of the top layer: 1–40 at % F, Si, and/or O, 60–99 at % C, with a remainder of hydrogen up to max. of 30 at %)

tubular or tubular bundle heat exchangers (composition of the top layer: 1–40 at % F, Si, and/or O, 60–99 at % C, with a remainder of hydrogen up to max. of 30 at %)

filling bodies in filling body columns (composition of the top layer: 1–40 at % N,O and/or B, 60–99 at % C, with a remainder of hydrogen up to max. of 30 at %)

condensers for forcing dropwise condensation (composition of the top layer: 1–40 at % F, Si, and/or O, 60–99 at % C, with a remainder of hydrogen up to max. of 30 at %)

heat/material exchanging walls and apparatus walls lead to a deliberate influencing of the adhesion mechanisms in such a way that the soiling inclination, the depositing inclination, and the caking inclination are advantageously counteracted (composition of the top layer: 1–40 at % F, Si, and/or O, 60–99 at % C, with a remainder of hydrogen up to max. of 30 at %).

The inadequacies of the prior art can be bypassed through the use of these specially adapted plasma polymer layers with adjustable, defined wetting behavior since in addition to the required hydrophobic property, they simultaneously have an extremely high wear resistance and service life and this is the case at layer thicknesses that have no significant heat resistivity.

The layers for use as a functional layer utilized in heat exchanger systems are plasma-modified amorphous hydrocarbon layers (a-C:H layers or DLC layers (diamond-like carbon)), which are usually deposited in a vacuum by means of a high frequency plasma process. But other processes, such as the pulse plasma technique, the middle frequency excitation, twin Mac process, diode sputtering, or the hollow cathode process, and other processes can also be used. Amorphous hydrocarbon layers can be deposited on a wide variety of substrates by introducing acetylene into a high-energy glow discharge (plasma), which is maintained, for example, by means of a high frequency coupling in the MHz range. These layers are deposited at a rate of a few mm/h. The chemical structure of the a-C:H layers is similar to that of highly cross-linked polymers, only the degree of cross-linkage is much higher. The degree of cross-linkage and therefore the layer properties can be influenced within a certain scope by means of a suitable carrying out of the process. Chemically speaking, purely amorphous hydrocarbon layers are merely comprised of carbon and hydrogen, wherein approx. 70–95 atom percent of carbon (97 wt. %) and 5–30 atom percent hydrogen is typical in the layers.

The high cross-linkage is the reason for the chemical stability of the layers as well as their resistance to the indiffusion of relative components, which could lead to a destruction of the base material (substrate). Fundamentally, the utility of the a-C:H layer material as a corrosion protection layer has been demonstrated. The a-C:H layer system is chemically resistant to oxidizing and non-oxidizing acids such as $HNO_3$ and HCl, lyes such as NaOH, and commercially available solvents.

Amorphous hydrocarbons deposited in a vacuum have been known as layering systems since approximately 1975. Taking into account suitable substrates and their pre-cleaning, it is basically no problem to coat both conducting and insulating surfaces. Layer thicknesses in the region of a few mm are deposited, wherein the growth rate of the layers is in the neighborhood of a few mm per hour. Hydrocarbon layers, commonly enriched with a metal component, are most widely used in the tribological region, where they are used to reduce coefficients of wear and friction. Improvements in wear behavior by a factor of 100 are achieved, in comparison with the wear behavior of steel.

Building on the basis of a-C:H layers (DLC layers), through the deliberate incorporation of other elements into the highly cross-linked hydrocarbon matrix, the wetting behavior can be deliberately influenced in relation to a wide variety of solvents, in particular, though, in relation to water. The incorporation of fluorine into the layers succeeds in producing a surface which, in its wetting behavior, corresponds to that of Teflon®, wherein, however, the very favorable wear behavior of the layers is essentially maintained. Similar effects can be achieved as well with the modification element silicon. The adjustability of the surface energy is not absolutely visible, but can on the contrary be adjusted deliberately via the fluorine or silicon content of the layers. This property of low surface energy is used to force the dropwise condensation in heat exchanger systems.

While fluorine and silicon markedly reduce the surface energy and consequently lead to a lower wetting by water, the opposite effect can be achieved by incorporating elements such as nitrogen, boron, or oxygen. These elements markedly increase the surface energy of a coated surface and lead to a clearly improved wetting by fluid media. This effect is utilized when the layers are used in systems for material transmission and material transport.

In addition to the modification of the overall surface energy, the corresponding combination of modification elements is also successful in the deliberate influencing of the polar and dispersed surface energy proportions, which add to the overall surface energy. Consequently, systems can be optimally adapted for their particular use.

The use of layers is meaningful not only in the field of condensation and material transport, but also in the field of heat transfer when boiling. Due to the thermal stability of the layers, there is a limit here that lies at the maximal temperature load of the layers of 450° C.

Another effect directly connected to the surface energy is that a clear reduction of the surface energy can also prevent a soiling of the surfaces in heat exchanger systems. The lower surface energy leads to a lower adhesion of dirt particles (e.g. the formation of sediment) and therefore to a greater ease in cleaning heat exchanger systems of this kind. Furthermore, through the use of the functional layers explained here, deposits and cakings of granular materials can also be prevented or reduced because a reduced surface energy counteracts the adhesion capability of particles to the wall [25].

The advantages of the functional layers are also a result of the fact that by means of their use in material transport and heat exchanger systems of this kind, properties such as an adjustable wetting behavior, wear protection functions, prevention of a corrosive action and/or of the topography-obtaining action, even in combination with one another, can be made useful for heat exchanger systems.

The invention will be explained in detail in conjunction with the following exemplary embodiments.

DETAILED DESCRIPTION OF THE INVENTION

Example 1

Figure 1:
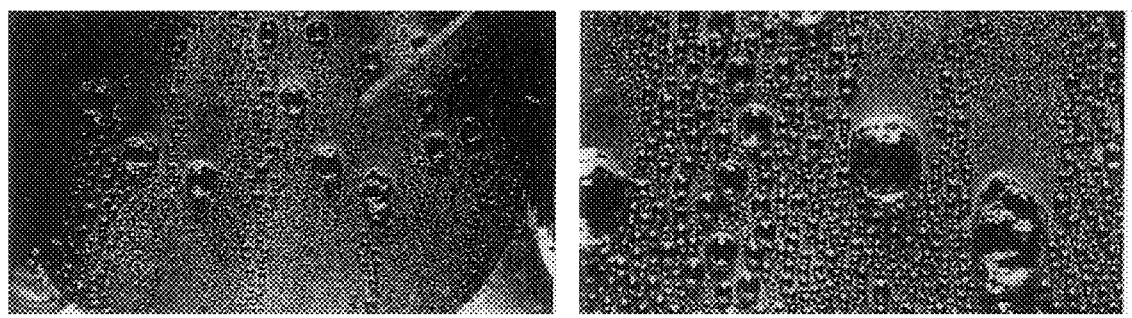
FIG. 1 shows the visual appearance of the dropwise condensation of a copper surface coated with SICAN.

The following Example 1 demonstrates one out of many conceivable technologically and economically usable improvements whose basis is the deliberate use of optimized functional layers and layer systems, which have predeterminable action characteristics on mechanically stable and favorably heat-conductive base materials (e.g. metal), in the fields of thermal process technology, heat and material transfer, and the apparatuses and systems required for them.

This example relates to the realization of dropwise condensation on surfaces through the deliberate use of a functional layer in condensers with a functional surface of the condenser wall comprised of different metals or metal alloys:

functional layer:
  SICAN (SICAN: term for the amorphous and modified hydrocarbon layer (a-C:H:Si))
  composition: 32 at % Si, 67.5 at % C, 0.5 at % O, and a remainder of hydrogen (not determined, but up to 30 at % present)
production of the functional layer:
  1. wet chemical cleaning of the heat exchanger surface
  2. cleaning of the heat exchanger surface by means of plasma etching with argon (1.5 Pa, −1500V bias, 50 sccm At)
  3. depositing of a 0.5 mm adhesion layer on the heat exchanger surface (1.5 Pa, −1200V bias, 50 sccm At/tetramethyl silane 1:1)
  4. depositing of a 2.5 mm functional layer on the heat exchanger surface (2 Pa, −800V bias, 50 sccm acetylene/tetramethyl silane 10:2)
condensing medium: condenser wall:
  pure saturated steam at ambient pressure
  smooth, vertically oriented and circular wall comprised of copper, aluminum, brass, and steel; the surface contacted by the condenser is coated
heat-absorbing medium:
  heat sink via cooling water of constant flow temperature in forced convection The condensation on surfaces that is considered here is the transition of a pure fluid from the vaporous state into the fluid state. A condition for this phase transition is a wall temperature that is lower than the saturation temperature of the adjacent vapor determined by the system pressure.

The condensation on cooled walls can occur in three differentiated forms:
  As film condensation when the condensate forms a continuous fluid film on the wall (condensate can completely wet the wall)
  as dropwise condensation when the condensate on the wall is produced in the form of individual droplets (condensate can only wet the wall incompletely)
  as mixed condensation when, for example, vapor mixtures condense, whose fluid phases cannot mix (mixed form of film condensation and dropwise condensation).

In the visible forms of condensation, the phenomenon of dropwise condensation has the highest heat transfer coefficients.

This form of condensation can be practiced when the condenser wall is effectively and permanently produced for an incomplete wettability by means of the condensate. The materials for the construction of heat transfer apparatuses are almost exclusively of a metallic type and due to their high surface energy, have a capability for being wetted (film formation) that is favorable in every respect. The dropwise condensation is intended to be adjusted through suitable wall coatings that prevent wetting.

The use of SICAN layers to achieve dropwise condensation is tested on an experimental rig in condensation operation with saturated steam at ambient pressure and the heat transmission capacity is determined from measurements.

Dropwise condensation is understood today to mean a nucleation process.

The first microscopically small droplets that are shown here as nucleation droplets, form at indicated positions on the condenser wall, at the nucleation points. These are points of particular geometry (recesses, pores), locally altered wettability, or a combination of the two.

The highest heat transfer coefficients are achieved with dropwise condensation, provided that the process takes place with the highest possible area proportion of the smallest droplets; this proposition is common to the model concepts.

The appearance of dropwise condensation presupposes limited wettability of the wall by the condensate. The boundaries fluid-vapor (gas), solid-fluid, and solid-vapor are decisive for the type of interaction between the wall and fluid.

Individual points from the experiments for dropwise condensation can be combined into a requirements profile in the promoter layer, so that this layer, deposited on metallic walls, permits the achievement of favorable conditions to bring about the dropwise condensation;

A) The promoter layer is intended to produce as low a surface energy of the condenser wall as possible so that the condensate forms in droplets that have a large edge angle and at the same time, have an edge angle hysteresis that is as small as possible.

B) Under use conditions, the promoter layer must have a stable action. This includes a strong adhesion of the layer to the base material and also a high corrosion resistance because material and structural alterations of the surface significantly influence the wettability.

C) The heat resistivity of the required promoter layer may not have a limiting effect on the heat transmission as a whole so that the goal of using the higher heat transfer coefficients in relation to film condensation can be achieved as effectively as possible.

D) The production and use of surfaces for the dropwise condensation must be economical, practicable, and environmentally compatible with regard to their service life and heat technical improvement.

The description of the capacity of a condensation phenomenon is clear due to the indication of the heat flow density transferred and with a corresponding temperature difference between the steam and the condenser surface. An individual process is then effective provided that the maximum heat flow densities are already transferred at a low temperature difference.

In an analogous manner, Newton's law of cooling applies to the description of the phase change process.

Figure 2:
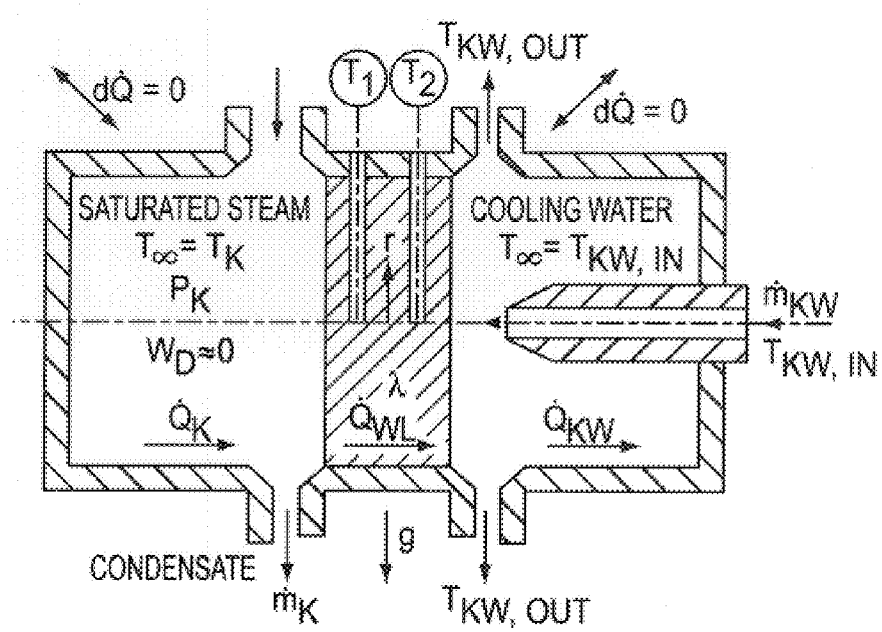
FIG. 2 is a schematic representation of the basic structure for heat technical measurements in the process of condensation.

FIG. 2 is a schematic representation of a basic structure for condensation measurements on the smooth, vertically oriented wall. This structure constitutes the base position for the technical measurement tasks, whose results are depicted here.

Figure 3:
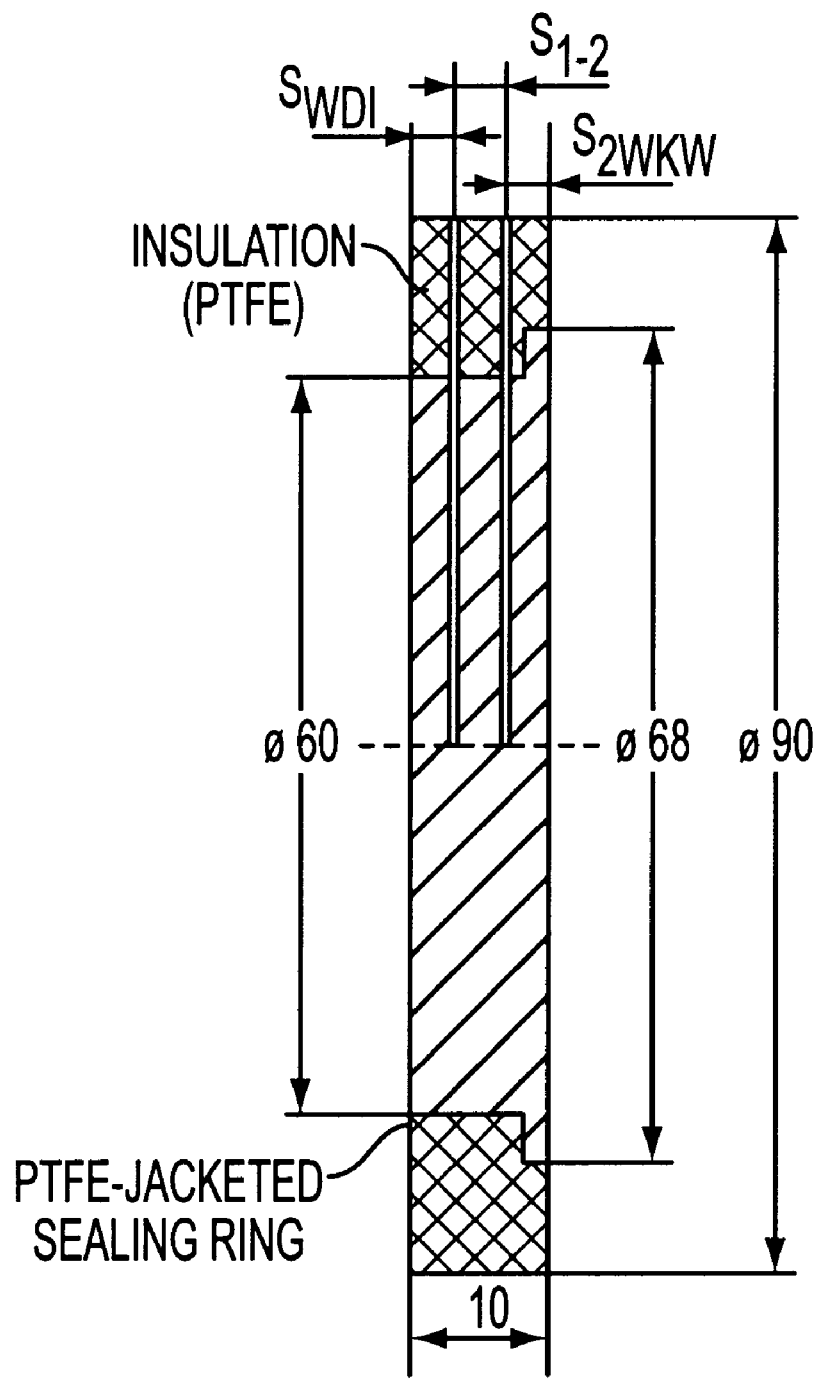
FIG. 3 shows a condenser disk with an insulation jacket (dimensions in mm)

The geometry of the condenser disks used is shown in FIG. 3. The coating is disposed on the side with the 60 mm diameter; the condensation occurs on this side of the disk. The disk jacket is packaged with a thick PTFE insulation in order to suppress uncontrolled heat flows here.

The temperature in the disk bores was measured with thermal elements (00.5 mm). The unidimensionality of the heat transfer is assessed by comparing the heat flow density balances of condensate, cooling water, and heat conduction. Details on the measurement technique and regarding the nature of individual heat transmissions will not be addressed here.

The capacity increase that can be achieved with dropwise condensation can be assessed via data comparison with the values of conventional film condensation.

Figure 4:
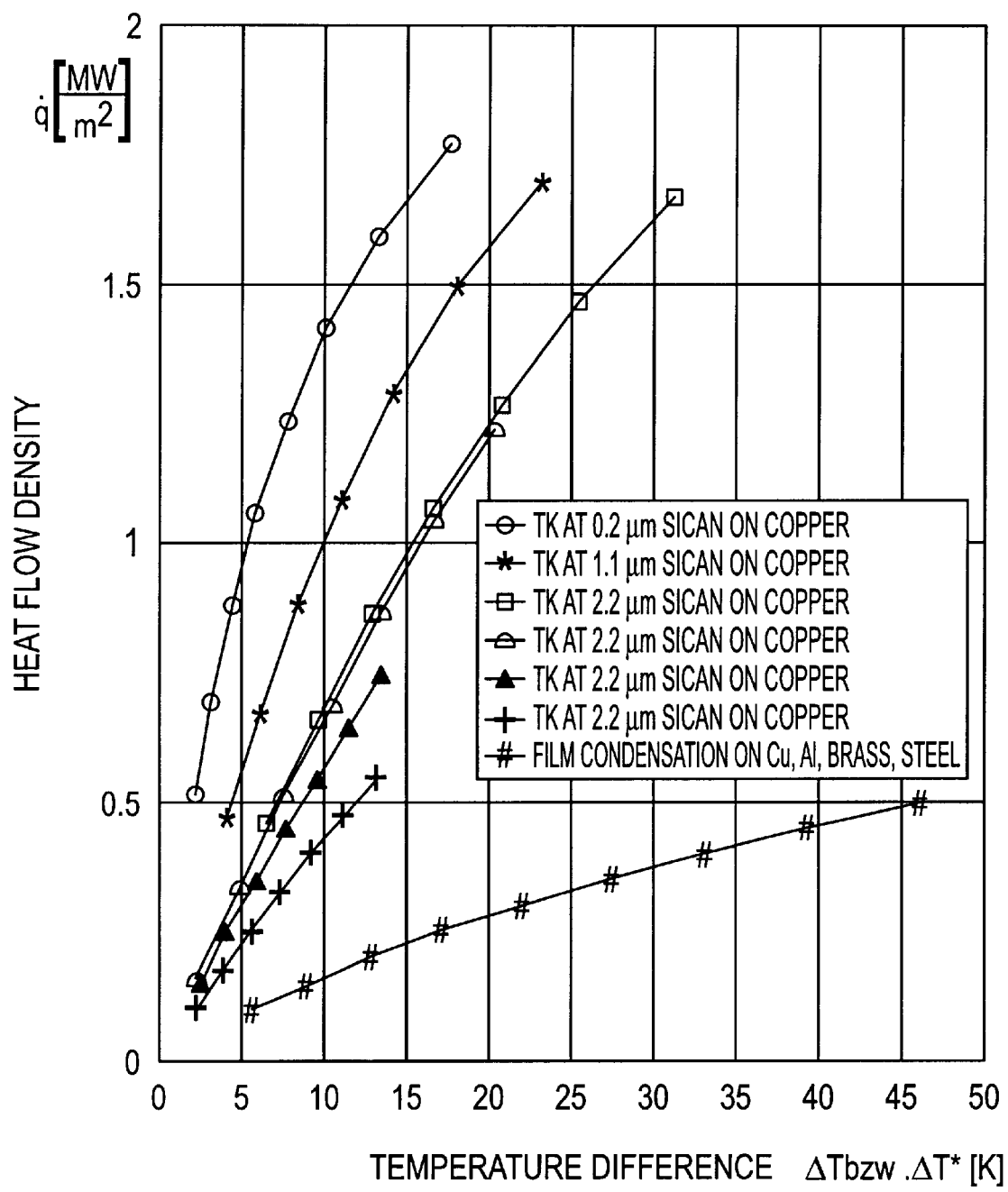
FIG. 4 shows the relationship of heat flow density and wall supercooling (saturated steam at ambient pressure p>1 bar) determined from the trials.

FIG. 4 shows the high capacity of dropwise condensation. This capacity increases the higher the temperature conductivity of the base material is and the thinner the promoter layer SICAN is.

Example 2

Example 2 shows another technologically and economically usable improvement based on the deliberate use of optimized functional layers and layer systems which have predeterminable action characteristics on mechanically stable and favorably heat-conductive base materials (e.g. metal) in the fields of thermal process technology, heat and material transfer, and the apparatuses and systems required for them.

In Example 2, this will be shown in conjunction with partial coatings on copper.

In many heat transfer processes with film condensation, particularly where thin walls are used, which have a high heat conductivity and a forced convective heat dissipation into a liquid flow (cooling water, turbulently flowing), the heat resistivity of the condensate film has a capacity limiting effect on the overall process heat transmission coefficient. For this reason, capacity increasing measures will be specified here first. The appearance of dropwise condensation is not connected to this kind of resistance. The whole process of heat transfer into the cooling water is intensified as a result.

The question arises as to whether a regional reduction of the condensation end heat resistivity is sufficient in order to thus achieve an order of magnitude that is equivalent to the nearest heat resistivity (cooling water or wall). As a result, an intensification of the overall characteristic curve of the capacity would already be achieved. Other effective capacity increases are produced only through the reduction of the limiting heat resistivity, which is now present in the convective heat transmission, though probably less often in the heat conduction process. In a practical sense, a further increase in the heat transfer with condensation is only a meaningful goal if the limiting heat resistivity of the heat sink or heat conduction process is first reduced. This kind of treatment of the heat transmission is expressed by means of the fundamental rule of heat transmission with resistances connected in series: "Each individual resistance as low as possible, but the cost required for them only as high as necessary, in order to bring all heat resistances into the same order of magnitude."

Table 2 shows the results of the edge angle measurements with super-clean water in laboratory atmosphere (21° C., rel. humidity>45%) with 20 ml droplet volumes as average values over a number of measurements in the circular promoter regions, wherein the percentage data in table 1 is related to the percentage proportion of the area coated for dropwise condensation to the overall area. The coated regions are circular surfaces with a diameter of approx. 10 mm (TB7=7 coated circles, TB13=13 coated circles, and TB19=19 coated circles on the condenser disk with a diameter of 60 mm).

TABLE 2 edge angle in the regions coated with promoter

| disk no. | base material | thickness of the SICAN layer | result of the edge angle measurement |
| --- | --- | --- | --- |
| TB 7 (19%) | copper | 1.1 mm | in the layer region 90° |
| TB 13 (36%) | copper | 1.1 mm | in the layer region 90° |
| TB 19 (53%) | copper | 1.1 mm | in the layer region 90° |

The depositing of the SICAN layer was carried out as described above in Example 1, wherein regions on which the coating was not desired were masked.

The locally forced dropwise condensation with simultaneous film condensation in the vicinity is a definite form of mixed condensation. Since the temperature of the condenser surface is drastically different by location, no average surface temperature can be determined through the extrapolation of a temperature measured at points in the solid body. The measurements shown here also demonstrated the greatest fluctuations of the temperature values of the disk sensor.

Information as to the effect of partial coatings can only be attained here comparatively by means of the integral balancing.

Figure 5:
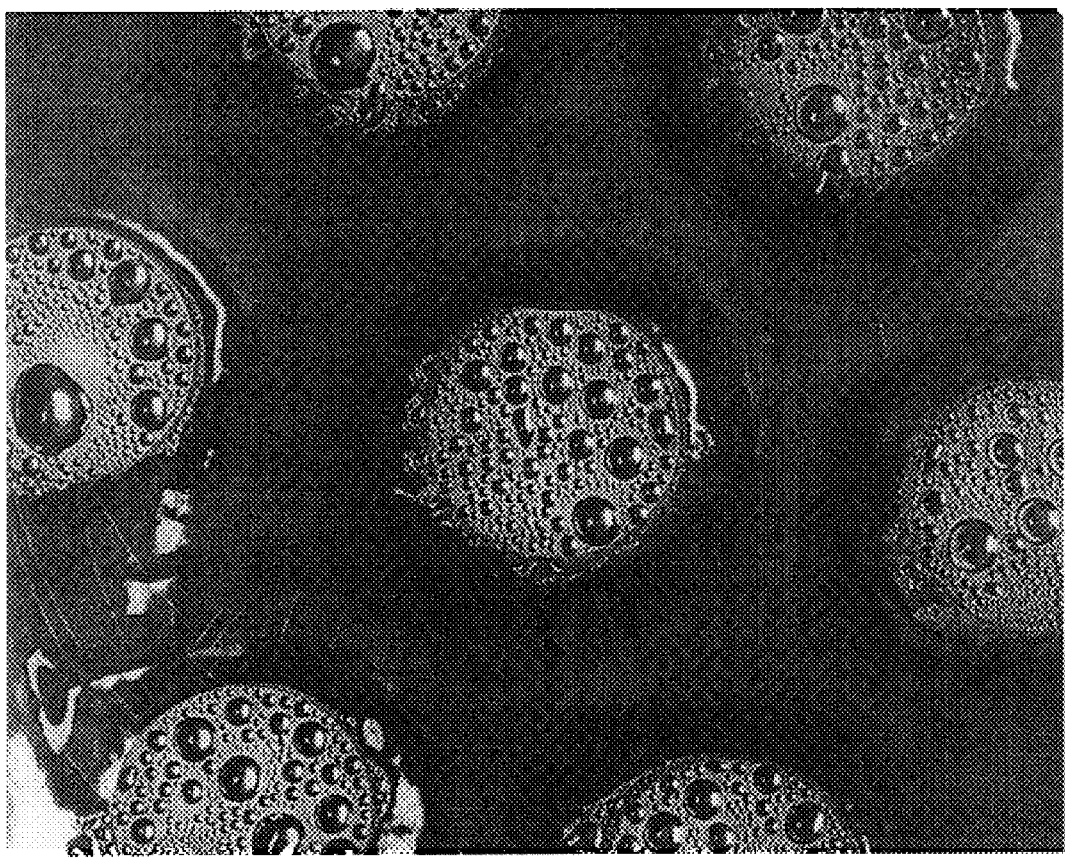
FIG. 5 shows the visual appearance of the forced mixed condensation on the disk TB7, which condensation is defined via partial coating.

Film condensation occurs in the dark region of FIG. 5. The film cannot spill over into the completely wettable dropwise condensation regions. The edge region of the coating acts as a solid barrier. This can be observed in every respect up to the highest condensate quantities. The condensate produced in the TK region is itself transported counter to the effect of gravity in all directions in the condensate film.

Figure 6:
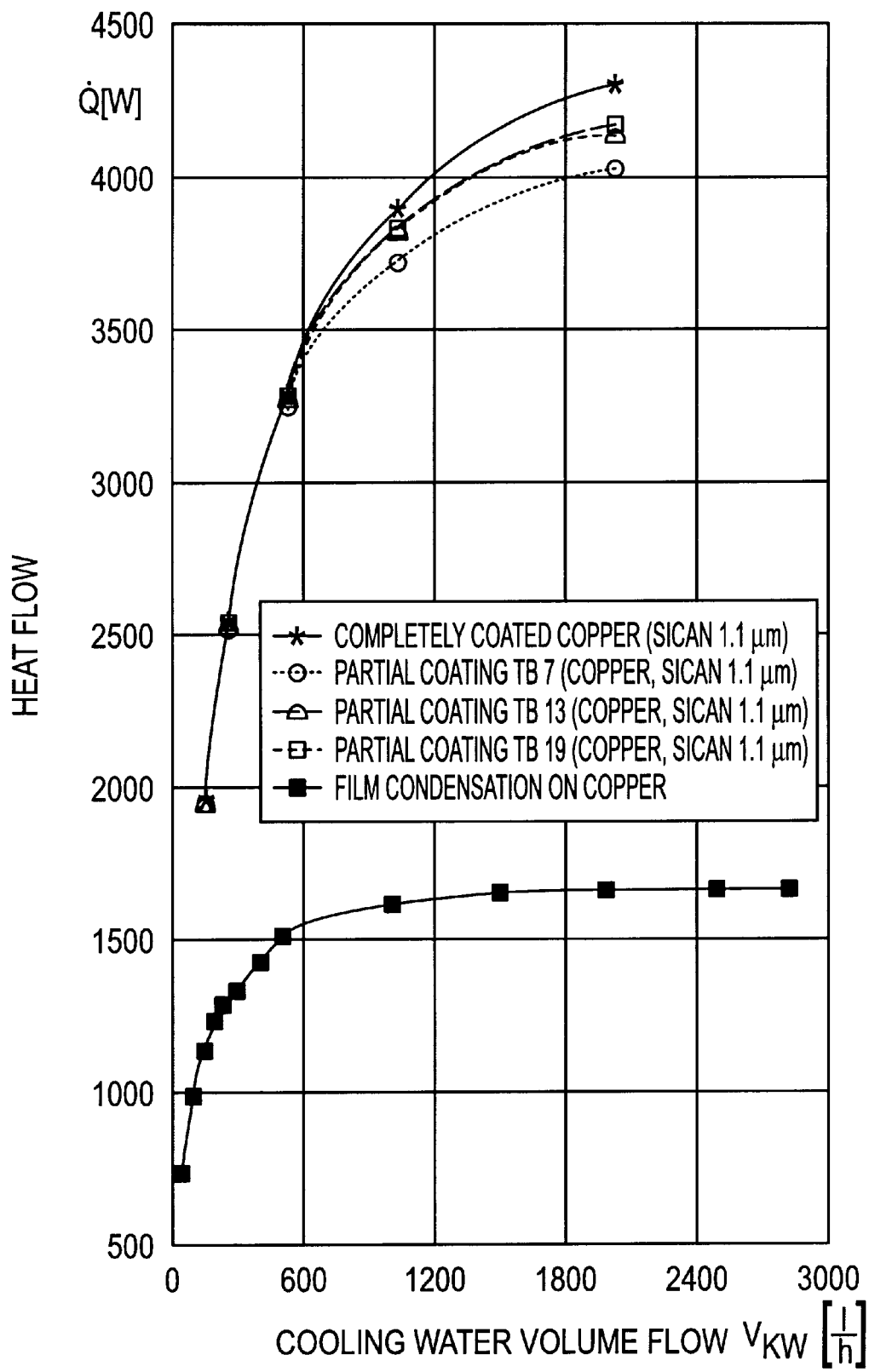
FIG. 6 shows the heat flow over the cooling water volume flow for the completely coated disk and for different partial coatings, measured with a single stream and constant wall thickness.

The subsequent FIG. 6 comparatively shows the results of the integral balancing in a constant apparatus configuration as heat flow over the volume flow of the cooling water used.

The depiction of uncertainties in the cooling water volume flow and in the heat flow have been omitted for the sake of the overview (error bands with regard to the heat flow fluctuate between ±0.9% (Q>4000W) and ±1.6% (Q<2000W).

Up to a measured cooling water volume flow of 500 l/h (third measurement point), equally high heat flows are determined with the partial coatings, as in the case of a complete coating. Only with very large occurrence of condensate (Q>3500W) is the complete coating superior to a partial coating.

Observation permits the recognition that with the partial coating in the zones of dropwise condensation, shorter cycle times predominate in comparison to the complete dropwise condensation, and in this way, the time of droplet production is concentrated via droplet growth until drop displacement. Rapid droplet movements occur, the condensate droplets travel into the condensate film, and they are "sucked up" by the film. With these observations and the essential fundamental finding that the integral capacity values are only increased by an intensification of the condensation if there is no other limiting heat resistivity, then the equality of the integral capacity values of all measurements at one operating point must be explained. The improved capacity of the complete coating only appears with large cooling water volume flows and the values of the partial coatings demonstrate an improved action with an increased coating proportion, i.e. an increased proportion of dropwise condensation. It is consequently definitely clear that the highest heat transmission coefficients are achieved with pure, complete dropwise condensation and that an interaction between the film and droplet region cannot demonstrably lead to an exceeding of the effectiveness of complete dropwise condensation.

With a view to the practical application of dropwise condensation, which after all is the overriding goal and in the end is to be achieved by the transmission of all relevant research results, the application of partial coatings is effectively possible. Comparative assessments show that economically achievable heat transmission coefficients of the heat sink are adapted with the testing device to a cooling water volume flow of up to 250 l/h (e.g. cooling water flow in the smooth tube, flow speeds of up to 2.5 m/s). For the entire process, a partial coating that already permits a dropwise condensation on 19% of the surface is just as effective as a complete coating. There are two ways of viewing this:

1. For many practical cases, a partial dropwise condensation can already be used effectively. Naturally, this is only meaningful if in realization, this stands out in relation to a complete coating by means of improved economy.

and

2. The results can and should further intensify the motivation for using dropwise condensation. The essential misgivings that are still currently expressed against the use of dropwise condensation are justified for some embodiments in the fact and for some embodiments in the assumption that in a comparatively short time in relation to the service life of the apparatus, the completeness of the dropwise condensation is lost as promoter defects spring up. In the end, these misgivings can only be reliably cleared up if the operative proof is supplied via the required service life. From the test results, it can be deduced that in many practical instances, up to 80% of the surface is permitted to be covered in film condensation without noticeable loss of capacity.

In the testing period with partial coatings (approx. 1 week per disk), no layer damage was observed at the artificially produced nucleation points for defects (layer edge).

Appendix 1

[1] Blackmann, L. C. F., Dewar, M. J. S., Hampson, H. An Investigation of Compounds Promoting the Dropwise Condensation of Steam J. Appl. Chem. 7, 160–171 (1957)

[2] Watson, R. G. H., Birt, D. C. P., Honour, C. W., Ash, B. W. The Promotion of Dropwise Condensation by Montan Wax I. Heat Transfer Measurement J. Appl. Chem. 12, 539–546 (1962)

[3] Tanner, D. W., Poll, A., Potter, J., Pope, D., West, D. The Promotion of Dropwise Condensation by Montan Wax II. The Composition of Montan Wax and the Mechanism of Promotion J. Appl. Chem. 12, 547–552 (1962)

[4] Finnicum, S. S., Westwater, J. W. Dropwise vs Filmwise Condensation of Steam on Chromium Int. J. Heat Mass Transfer, Vol. 32, 1541–1559 (1989)

[5] Mingdao, X., Jiliang, X. Heat Transfer by Dropwise Condensation in the Two-phase Closed Thermosiphons Proc. VIIIth Int. Heat Transfer Conf., Vol. 4, 1683–1688 (1986)

[6] Kast, W. Theoretische und experimentelle Untersuchung der Wärmeübertragung bei Tropfenkondensation [Theoretical and Experimental Testing of the Heat Transmission in Dropwise Condensation] Fortschrittsber. VDI, series 3, no. 6, Düsseldorf (1965)

[7] Marto, P. J., Looney, D. J., Rose, J. W., Wanniarachchi, A. S. Evaluation of Organic Coatings for the Promotion of Dropwise Condensation of Steam Int. J. Heat Transfer 29, 1109–1117 (1986)

[8] Holden, K. M., Wanniarachchi, A. S., Marto, P. J., Boone, D. H., Rose, J. W. The Use of Organic Coatings to Promote Dropwise Condensation of Steam Asme. J. Heat Transfer 109, 768–774 (1987)

[9] Mori, K., Fujita, N., Horie, H., Mori, S., Miyashita, T., Matsuda, M. Heat Transfer Promotion of an Aluminum-Brass Cooling Tube by Surface Treatment with Triazine Thiols Langmuir, Vol. 7, 1161–1166 (1991)

[10] Haraguchi, T., Shimada, R., Kumagai, S., Takeyama, T. The Effect of Polyvinylidene Chloride Coating Thickness on Promotion of Dropwise Steam Condensation Int. J. Heat Mass Transfer, Vol. 34, 3047–3054 (1991)

[11] Utaka, Y., Saito, A., Tani, T., Shibuya, H., Katayama, K. Study on Dropwise Condensation Curves (Measurement of Propylene Glycol Vapor on PTFE-coated Surface) Bulletin of JSME, Vol. 28, 1150–1157 (1985)

[12] Boyes, A. P., Ponter, A. B. Wettability of Copper and Polytetrafluoroethylene Surfaces with Water—the Influence of Environmental Conditions Chemie-Ing.-Techn. [Chem. Eng. Techn.] 45, 1250–1256 (1973)

[13] Erb, R. A., Thelen, E. Promoting Permanent Dropwise Condensation Industrial and Engineering Chemistry 57, (1965)
[14] Cluistra, A., Oerlemans, P., Ploem, W. Dropwise Condensation in PTFE-containing Galvalnic Dispersion Layers unpublished in-house report of the AKZO-Engineering Co. Research Laboratories Arnhem, 1–26 (1976)
[15] Zhang, D. C., Lin, Z. Q., Lin, J. F. New Surface Materials for Dropwise Condensation Proc. VIIIth Heat Transfer Conf. 4, 1677–1682 (1986)
[16] Zhao, Q., Zhang, D.C., Lin, J. F. Surface Materials with Dropwise Condensation Made by Ion Implantation Technology Int. J. Heat Mass Transfer, 34, 2833–2835 (1991)
[17] Zhao, Q., Zhang, D.C., Zhu, X. B., Xu, D. Q., Lin, Z. Q., Lin, J. F. Industrial Application of Dropwise Condensation Proc. IXth Heat Transfer Conf. 4, 391–394 (1990)
[18] Bernett, M. K., Zisman, W. A. Confirmation of Spontaneous Spreading by Water on Pure Gold The Journal of Physical Chemistry, Vol. 74, 2309–2312 (1970)
[19] Smith, T. The Hydrophilic Nature of a Clean Gold Surface J. of Colloid and Interface Science, Vol. 75, 51–55 (1980)
[20] Wilkins, D. G., Bromley, L. A., Read, S. M. Dropwise and Filmwise Condensation of Water Vapor on Gold AlCheE Journal, Vol. 19, 119–123 (1973)
[21] Tanasawa, I., Westwater, J. W. What We Don't Know About the Mechanism of Dropwise Condensation Proc. Vth Int. Heat Transfer Conf., Vol. 7, 186–191 (1974)
[22] Woodruff, D. W., Westwater, J. W. Steam Condensation on Various Gold Surfaces Journal of Heat Transfer, Vol. 103, 685–692 (1981)
[23] Barthau, G. Dropwise Condensation of Steam—an Experimental Study Proc. of Int. Symp. on Phase Change Heat Transfer, 328–333 (1988)
[24] O'Neill, G. A., Westwater, J. W. Dropwise Condensation of Steam on Electroplated Silver Surfaces Int. J. Heat Mass Transfer, Vol. 27, 1539–1549 (1984)
[25] Hollinderbäumer, E. W., Seewald, H. Anbackungen und Ablagerungen feuchter Schüttgüter [Cakings and Deposits of Moist Bulk Materials] Chem.-Ing.-Techn. [Chem. Eng. Techn.] 68, 127–130 (1996)

What is claimed is:

1. A material transport or heat exchanger system comprising a material transport or heat exchanger system component including a base material, said component including a top functional layer adjusting wetting behavior of said material transport or heat exchanger system component so as to have an edge angle of greater than 60° relative to water, said top functional layer comprising carbon and hydrogen, and at least one of a non-metallic element and a semi-metallic element selected from the group consisting of 3rd, 4th, 5th, 6th and 7th main group of the periodic table of elements, and mixtures thereof.

2. The material transport or heat exchanger system according to claim 1, wherein said top functional layer comprises carbon and hydrogen, and 1 at % to 70 at %, with respect to the carbon content, of said at least one of a non-metallic element and a semi-metallic element of the 3rd, 4th, 5th, 6th, 7th main group of the periodic table of the elements, and mixtures thereof.

3. The material transport or heat exchanger system according to claim 2, wherein said top functional layer comprises carbon and hydrogen, and at least one member selected from the group consisting of fluorine, boron, silicon, nitrogen, and oxygen.

4. The material transport or heat exchanger system according to claim 1, wherein said top functional layer comprises carbon and hydrogen, and at least one member selected from the group consisting of fluorine, boron, silicon, nitrogen, and oxygen.

5. The material transport or heat exchanger system according to claim 1, wherein said at least one component comprises at least a portion of a heat exchanger system including plate heat exchangers, and wherein said top functional layer comprises 1–40 at % of at least one member selected from the group consisting of F, Si, and O, 60–99 at % C, with a remainder of hydrogen, with said hydrogen comprising a maximum of 30 at %.

6. The material transport or heat exchanger system according to claim 1, wherein said at least one component comprises at least a portion of a tubular or tubular bundle heat exchanger, and wherein said top functional layer comprises 1–40 at % of at least one member selected from the group consisting of F, Si, and O, 60–99 at % C, with a remainder of hydrogen, with said hydrogen comprising a maximum of 30 at %.

7. The material transport or heat exchanger system according to claim 1, wherein said at least one component comprises filling bodies in filling body columns, and said top functional layer comprises 1–40 at % of at least one member selected from the group consisting of N, O and B, 60–99 at % C, with a remainder of hydrogen, with said hydrogen comprising a maximum of 30 at %.

8. The material transport or heat exchanger system according to claim 1, wherein said at least one component comprises at least a portion of a condenser, and said top functional layer comprises 1–40 at % of at least one member selected from the group consisting of F, Si, and O, 60–99 at % C, with a remainder of hydrogen, with said hydrogen comprising a maximum of 30 at %.

9. The material transport or heat exchanger system according to claim 1, wherein said at least one component comprises heat or material transferring walls, and, in order to reduce the adhesion of at least one of dirt and other particles, said top functional layer comprises 1–40 at % of at least one member selected from the group consisting of F, Si, and O, 60–99 at % C, with a remainder of hydrogen, with said hydrogen comprising a maximum of 30 at %.

10. The material transport or heat exchanger system according to claim 1, wherein said top functional layer only coats a portion of said material transport or heat exchanger system.

11. The material transport or heat exchanger system according to claim 1, wherein said top functional layer is produced by plasma vapor deposition.

12. The material transport or heat exchanger system according to claim 1, wherein said top functional layer is produced by chemical vapor deposition.

13. The material transport or heat exchanger system according to claim 1, wherein said top functional layer is produced by plasma enhanced chemical vapor deposition.

14. The material transport or heat exchanger system according to claim 1, further including an intermediary layer between said base material and said top functional layer.

15. The material transport or heat exchanger system according to claim 14, further including a gradient layer between said base material and said top functional layer.

16. The material transport or heat exchanger system according to claim 1, further including a gradient layer between said base material and said top functional layer.

17. The material transport or heat exchanger system of claim 1, wherein the top functional layer comprises diamond-like carbon.

18. A component of a material transport or heat exchanger system comprising a base material and a top functional layer adjusting wetting behavior of said component so as to have an edge angle of greater than 60° relative to water, said top functional layer comprising carbon and hydrogen, and at least one of a non-metallic element and a semi-metallic element selected from the group consisting of 3rd, 4th, 5th, 6th and 7th main group of the periodic table of elements, and mixtures thereof.

19. The component according to claim 18, wherein said top functional layer comprises carbon and hydrogen, and 1 at % to 70 at %, with respect to the carbon content, of said at least one of a non-metallic element and a semi-metallic element of the 3rd, 4th, 5th, 6th, 7th main group of the periodic table of the elements, and mixtures thereof.

20. The component according to claim 19, wherein said top functional layer comprises carbon and hydrogen, and at least one member selected from the group consisting of fluorine, boron, silicon, nitrogen, and oxygen.

21. The component according to claim 18, wherein said top functional layer comprises carbon and hydrogen, and at least one member selected from the group consisting of fluorine, boron, silicon, nitrogen, and oxygen.

22. The component according to claim 18, wherein said at least one component comprises at least a portion of a heat exchanger system including plate heat exchangers, and wherein said top functional layer comprises 1–40 at % of at least one member selected from the group consisting of F, Si, and O, 60–99 at % C, with a remainder of hydrogen, with said hydrogen comprising a maximum of 30 at %.

23. The component according to claim 18, wherein said at least one component comprises at least a portion of a tubular or tubular bundle heat exchanger, and wherein said top functional layer comprises 1–40 at % of at least one member selected from the group consisting of F, Si, and O, 60–99 at % C, with a remainder of hydrogen, with said hydrogen comprising a maximum of 30 at %.

24. The component according to claim 18, wherein said at least one component comprises filling bodies in filling body columns, and said top functional layer comprises 1–40 at % of at least one member selected from the group consisting of N, O and B, 60–99 at % C, with a remainder of hydrogen, with said hydrogen comprising a maximum of 30 at %.

25. The component according to claim 18, wherein said at least one component comprises at least a portion of a condenser, and said top functional layer comprises 1–40 at % of at least one member selected from the group consisting of F, Si, and O, 60–99 at % C, with a remainder of hydrogen, with said hydrogen comprising a maximum of 30 at %.

26. The component according to claim 18, wherein said at least one component comprises heat or material transferring walls, and, in order to reduce the adhesion of at least one of dirt and other particles, said top functional layer comprises 1–40 at % of at least one member selected from the group consisting of F, Si, and O, 60–99 at % C, with a remainder of hydrogen, with said hydrogen comprising a maximum of 30 at %.

27. The component of claim 18, wherein the top functional layer comprises diamond-like carbon.

28. A process for treating a surface of at least one component comprising a base material of a material transport or heat exchanger system, comprising forming a top functional layer on at least a portion of the at least one component which adjusts wetting behavior of said at least one component so as to have an edge angle of greater than 60° relative to water, the top functional layer comprising carbon and hydrogen, and at least one of a non-metallic element and a semi-metallic element selected from the group consisting of 3rd, 4th, 5th, 6th and 7th main group of the periodic table of elements, and mixtures thereof.

29. The process of claim 28, wherein the top functional layer comprises diamond-like carbon.

* * * * *